(12) United States Patent
Li et al.

(10) Patent No.: US 7,882,465 B2
(45) Date of Patent: Feb. 1, 2011

(54) FPGA AND METHOD AND SYSTEM FOR CONFIGURING AND DEBUGGING A FPGA

(75) Inventors: Yu Li, Beijing (CN); Guo Hui Lin, Beijing (CN); Qiang Liu, Beijing (CN); Yu Dong Yang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 11/944,408

(22) Filed: Nov. 21, 2007

(65) Prior Publication Data
US 2008/0116919 A1 May 22, 2008

(30) Foreign Application Priority Data
Nov. 21, 2006 (CN) .................... 2006 10 149473

(51) Int. Cl.
*G06F 17/50* (2006.01)
*H04B 1/38* (2006.01)
*H03K 19/173* (2006.01)
*G01R 31/28* (2006.01)

(52) U.S. Cl. ................ 716/4; 716/16; 375/219; 714/725; 326/38

(58) Field of Classification Search ............. 714/725; 375/219; 326/37–38, 41; 716/4, 16
See application file for complete search history.

(56) References Cited

U.S. PATENT DOCUMENTS

| | | | | |
|---|---|---|---|---|
| 6,107,821 A * | 8/2000 | Kelem et al. | ............ | 326/38 |
| 6,617,877 B1 * | 9/2003 | Cory et al. | ............ | 326/41 |
| 6,760,898 B1 * | 7/2004 | Sanchez et al. | ............ | 716/16 |
| 6,829,751 B1 * | 12/2004 | Shen et al. | ............ | 716/4 |
| 6,960,933 B1 * | 11/2005 | Cory et al. | ............ | 326/38 |
| 6,970,013 B1 * | 11/2005 | Cory | ............ | 326/38 |
| 7,047,464 B2 * | 5/2006 | Bailis et al. | ............ | 714/725 |
| 7,187,709 B1 * | 3/2007 | Menon et al. | ............ | 375/219 |
| 7,215,137 B1 * | 5/2007 | Nisbet | ............ | 326/38 |
| 7,308,630 B2 * | 12/2007 | Grupp et al. | ............ | 714/725 |
| 7,440,495 B1 * | 10/2008 | Hagen | ............ | 375/219 |
| 7,458,042 B2 * | 11/2008 | Colle et al. | ............ | 716/3 |
| 7,493,434 B1 * | 2/2009 | Abramovici | ............ | 710/118 |
| 7,536,615 B1 * | 5/2009 | Pierce et al. | ............ | 714/725 |
| 7,672,416 B2 * | 3/2010 | Hadzic et al. | ............ | 375/360 |
| 2002/0089349 A1 * | 7/2002 | Barbier et al. | ............ | 326/39 |
| 2004/0178820 A1 * | 9/2004 | Barbier et al. | ............ | 326/40 |
| 2005/0273660 A1 * | 12/2005 | Colle et al. | ............ | 714/27 |
| 2006/0064678 A1 * | 3/2006 | Colle et al. | ............ | 717/124 |

\* cited by examiner

*Primary Examiner*—Stacy A Whitmore
(74) *Attorney, Agent, or Firm*—Ido Tuchman; Vazken Alexanian

(57) ABSTRACT

The present invention provides a Field Programmable Gate Array (FPGA), a system for debugging a Field Programmable Gate Array, a method for debugging a Field Programmable Gate Array, a FPGA configuration data product and a method and system for configuring a FPGA. According to one aspect of the invention, there is provided a Field Programmable Gate Array (FPGA) having a logic unit under test and comprising: a probe signal selecting unit configured to select at least one probe point from a plurality of probe points in said logic unit under test, and obtain a probe signal at said probe point; and a high speed serial transceiver configured to convert said probe signal into a high speed serial signal and transmit it to outside.

12 Claims, 4 Drawing Sheets

FPGA AND METHOD AND SYSTEM FOR CONFIGURING AND DEBUGGING A FPGA

CROSS-REFERENCE TO RELATED APPLICATIONS

This application claims priority under 35 U.S.C. §119 to Chinese Patent Application No. 200610149473.3 filed Nov. 21, 2006, the entire text of which is specifically incorporated by reference herein.

BACKGROUND OF THE INVENTION

The present invention relates to technology of FPGA, more particularly, to technology of debugging a FPGA design.

FPGA is abbreviation for Field Programmable Gate Array, which is a product further developed on the basis of programmable devices such as Programmable Array Logic (PAL), Generic Array Logic (GAL), Erasable Programmable Logic Device (EPLD), etc. It appears as a semi-customized circuit in field of Application Specific Integrated Circuit (ASIC), it solves the deficiency in customized circuit, while overcomes shortcomings that prior programmable device has limited number of gate circuits.

FPGA employs such a new concept as Logic Cell Array (LCA), which contains three parts therein: Configurable Logic Block (CLB), Input Output Block (IOB) and Interconnect. The basic features of a FPGA are:

1) Using a FPGA to design an ASIC circuit, user can obtain qualified chips without needing to put chip into production.

2) FPGA can act as an intermediate sample chip of other full-customized or semi-customized ASIC circuits.

3) FPGA has abundant flip-flops and I/O pins.

4) FPGA is one of the devices in ASIC circuit that has shortest design period, lowest development cost and lowest risk.

5) FPGA employs a high speed Complementary High-performance Metal Oxide Semiconductor (CHMOS) process, which has low power consumption, and is compatible with Complementary Metal Oxide Semiconductor (CMOS), transistor-transistor logic (TTL) level.

It can be said that FPGA chip is one of the best choices for small batch system to improve system integrity and reliability.

After more than ten years' development, a number of companies have developed various programmable logic devices. Among them are Xilinx's FPGA device series and Altera's CPLD device series, which are developed early and occupy a relative large portion of PLD market.

The working state of a FPGA is set by the program stored in on-chip Random Access Memory (RAM), therefore, the on-chip RAM needs to be programmed during working. User can employ different programming manners according to different configuration modes.

When powering on, the FPGA chip reads data in Erasable Programmable Read Only Memory (EPROM) into on-chip programmable RAM, after configuration, the FPGA enters working state. When powering off, the FPGA restores to a blank chip and its internal logic relationship disappears. Thus, FPGA can be used repeatedly. FPGA's programming does not need special FPGA programmer, and only use generic EPROM, PROM (Programmable Read Only Memory) programmer. When there is a need to modify the FPGA function, what is needed is to replace the EPROM. Thus, a same piece of FPGA with different programming data can yield different circuit functions. Therefore, the usage of FPGA is very flexible.

A FPGA has a number of configuration modes: parallel master mode is one piece of FPGA plus one piece of EPROM; master slave mode can support using one piece of PROM to program multiple pieces of FPGA; serial mode can use serial PROM to program FPGA; peripheral mode can use FPGA as peripheral device of a microprocessor and the FPGA is programmed by the microprocessor.

FPGA's designer generally will test and debug the FPGA before manufacturing the FPGA in large scale for commercial purposes. The designer hopes to detect signals coming into/from a FPGA, so that the designer can identify and correct any design problems (for example, programming errors) related to the FPGA.

However, with the complexity of FPGA design increases, FPGA's debugging becomes a big challenge to digital system designers. Currently used debugging manner includes using a logic analyzer or JTAG (Joint Test Action Group) based software debugger to trace behavior and signals in the FPGA.

A method that uses logic analyzer generally needs to connect the logic analyzer to the FPGA. The designer then uses the logic analyzer to capture samples of these signals. However, this method needs to route FPGA's internal nodes to some physical I/O pins, so that the logic analyzer's probe can be connected to these physical pins to perform detection. While it is a very useful method, it has significant drawbacks:

I/O pins are very expensive resources in FPGA, and only a few numbers of I/O pins are available for testing and debugging;

it has problem of signal intensity and time delay;

it requires additional layer and is difficult to design, thereby increases PCB (Printed Circuit Board) cost;

this debugging method is unilateral, it can only capture FPGA's internal signal through the logic analyzer, and could not input designer's desired test or stimulation signal.

A method that uses JTAG based software debugger generally needs to use internal logic resources to build trigger logic and store sample data in on-chip SPAM, then send the sample data to PC (Personal Computer) via JTAG cable. Although this method is a low cost solution for FPGA debugging, it has significant drawbacks:

it uses FPGA internal SRAM as sample buffer, which may affects logic design;

sample depth is restricted by capacity of SRAM;

the response time is long and could not capture continuous data flow;

the trigger function is restricted.

BRIEF SUMMARY OF THE INVENTION

To solve the above problems in prior art, the present invention provides a Field Programmable Gate Array (FPGA), a system for debugging Field Programmable Gate Array, a method for debugging Field Programmable Gate Array, a FPGA configuration data product and method and system for configuring a FPGA.

According to one aspect of the invention, there is provided a Field Programmable Gate Array (FPGA) having a logic unit under test and comprising:

a probe signal selecting unit configured to select at least one probe point from a plurality of probe points in said logic unit under test, and obtain a probe signal at said probe point; and a high speed serial transceiver configured to convert said probe signal into a high speed serial signal and transmit it to outside.

According to another aspect of the invention, there is provided a system for debugging Field Programmable Gate Array, comprising:

said FPGA; and an analyzing means configured to receive and analyze a signal sent by said high speed serial transceiver.

According to another aspect of the invention, there is provided a method for debugging Field Programmable Gate Array, said Field Programmable Gate Array includes a logic unit under test, said method comprising the steps of:

probing a probe signal of at least one probe point in said logic unit under test;

converting said probe signal into a high speed serial signal and sending it to an external analyzing means; and analyzing said signal.

According to another aspect of the invention, there is provided a FPGA configuration data product, when loaded into a FPGA, enabling the FPGA to have following functional modules:

a probe signal selecting unit configured to select at least one probe point from a plurality of probe points in a logic unit under test of said FPGA, and obtain a probe signal at said probe point; and a high speed serial transceiver configured to convert said probe signal into a high speed serial signal and transmit it to outside.

According to another aspect of the invention, there is provided a method for configuring a FPGA, comprises loading configuration data into the FPGA to enabling the FPGA to have following functional modules:

a probe signal selecting unit configured to select at least one probe point from a plurality of probe points in a logic unit under test of said FPGA, and obtain a probe signal at said probe point; and a high speed serial transceiver configured to convert said probe signal into a high speed serial signal and transmit it to outside.

According to another aspect of the invention, there is provided a system for configuring a FPGA, comprises loading configuration data into means in the FPGA to enabling the FPGA to have following functional modules:

a probe signal selecting unit configured to select at least one probe point from a plurality of probe points in a logic unit under test of said FPGA, and obtain a probe signal at said probe point; and a high speed serial transceiver configured to convert said probe signal into a high speed serial signal and transmit it to outside.

BRIEF DESCRIPTION OF THE SEVERAL VIEWS OF THE DRAWINGS

It is believed that the above and other features, advantages and objects of the invention will be better understood from the description of the detailed implementation of the invention in conjunction with accompany drawings, in which.

DETAILED DESCRIPTION OF THE INVENTION

Next, various embodiments of the invention will be described in detail in conjunction with accompany drawings.

Field Programmable Gate Array (FPGA)

Figure 1:
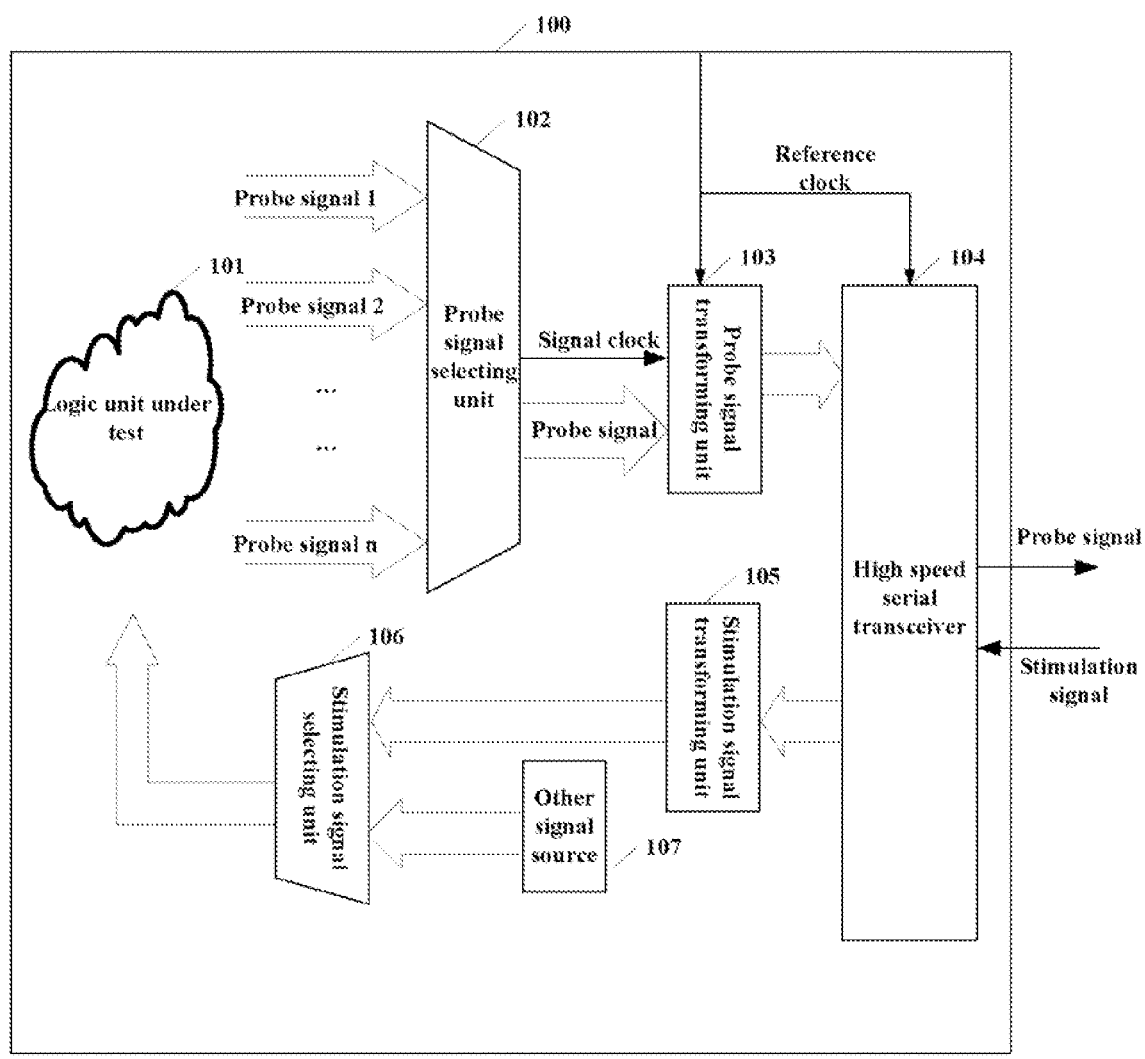
FIG. 1 is a block diagram of a FPGA according to one embodiment of the invention.

FIG. 1 is a block diagram of a FPGA according to one embodiment of the invention.

As shown in FIG. 1, FPGA 100 of the present embodiment comprises logic unit under test 101, probe signal selecting unit 102, probe signal transforming unit 103, high speed serial transceiver 104, stimulation signal transforming unit 105, stimulation signal selecting unit 106, and other signal source 107. It should be understood that FPGA 100 of the present embodiment further comprises other modules and components of the prior art that implement FPGA functions, which are not shown here and won't be described for brevity. The structure, principle and function of these components and connection relationships between each other will be described in detail in the following.

Logic unit under test 101 contains gate arrays that implement FPGA 100's logic function, and specific logic functions are realized by configuring the gate arrays. Before FPGA 100 is put into use, designers need to test and debug logic unit under test 101, so that designers can identify and correct any design problems related to logic unit under test 101, for example, programming errors.

To test and debug logic unit under test 101, signals in logic unit under test 101 must be probed, and test and debug is performed by analyzing the probed signal. The present embodiment use probe signal selecting unit 102 to select at least one probe point from a plurality of probe points in said logic unit under test 101 and obtain probe signal at said probe point, at the same time, obtain clock of that probe signal, and send the probed probe signal and signal clock to high speed serial transceiver 104. Probe signal selecting unit 102 can employ any signal selecting unit known to those skilled in the art, for example, the signal selecting unit described in U.S. patent publication US25262492A1, especially in 214, 216, 217 of FIG. 3A, or other forms of signal selecting unit, as long as it can select one or more probe points from a plurality of probe points in logic unit under test 101 to perform test, and the invention has no limitation to this.

High speed serial transceiver 104 converts said probe signal into high speed serial signal and transmits it to outside. In particular, high speed serial transceiver 104 is an I/O device integrated in FPGA, which is a time division multiplexing (TDM), point-to-point communication technology, that is, at send side, multiple low speed parallel signals are transformed into a high speed serial signal, passed through transmission media (optical cable or copper cable), finally at receive side, the high speed serial signal is re-transformed into low speed parallel signals. This point-to-point serial communication technology makes full use of transmission media's channel capacity, reduces the number of transmission channels and device pins needed, and thereby significantly reduces communication cost.

A typical high speed serial transceiver comprises a send channel and a receive channel; the send channel comprises an encoder, a serializer, a sender and a clock generation circuit; the receive channel comprises a decoder, a deserializer, a receiver and a clock recovery circuit. As the name implies, the encoder and decoder realize encode and decode function, wherein 8B/10B, 64B/66B and scrambling are most commonly used encoding scheme. The serializer and deserializer are responsible for converting from parallel to serial and from serial to parallel. The serializer needs the clock generation circuit, and the clock generation circuit is often realized by phase-locked loop (PLL). The deserializer needs the clock and data recovery circuit (CDR), and generally the clock recovery circuit is also realized by the phase-locked loop, but it has many implementations such as phase interpolation, surplus sample, etc. The sender and receiver realize sending and receiving of differential signal, wherein LVDS and CML are two most commonly used differential signal standards. Also, some auxiliary circuits are necessary, such as loopback test, build-in error rate test, etc.

For detailed structure of high speed serial transceiver 104, see Xilinx's technical document "Virtex-4 RocketIO Gigabit Transceiver User Guide".

When said probe signal does not match high speed serial transceiver 104, probe signal transforming unit 103 transforms the probe signal into signal that matches high speed serial transceiver 104.

Figure 2:
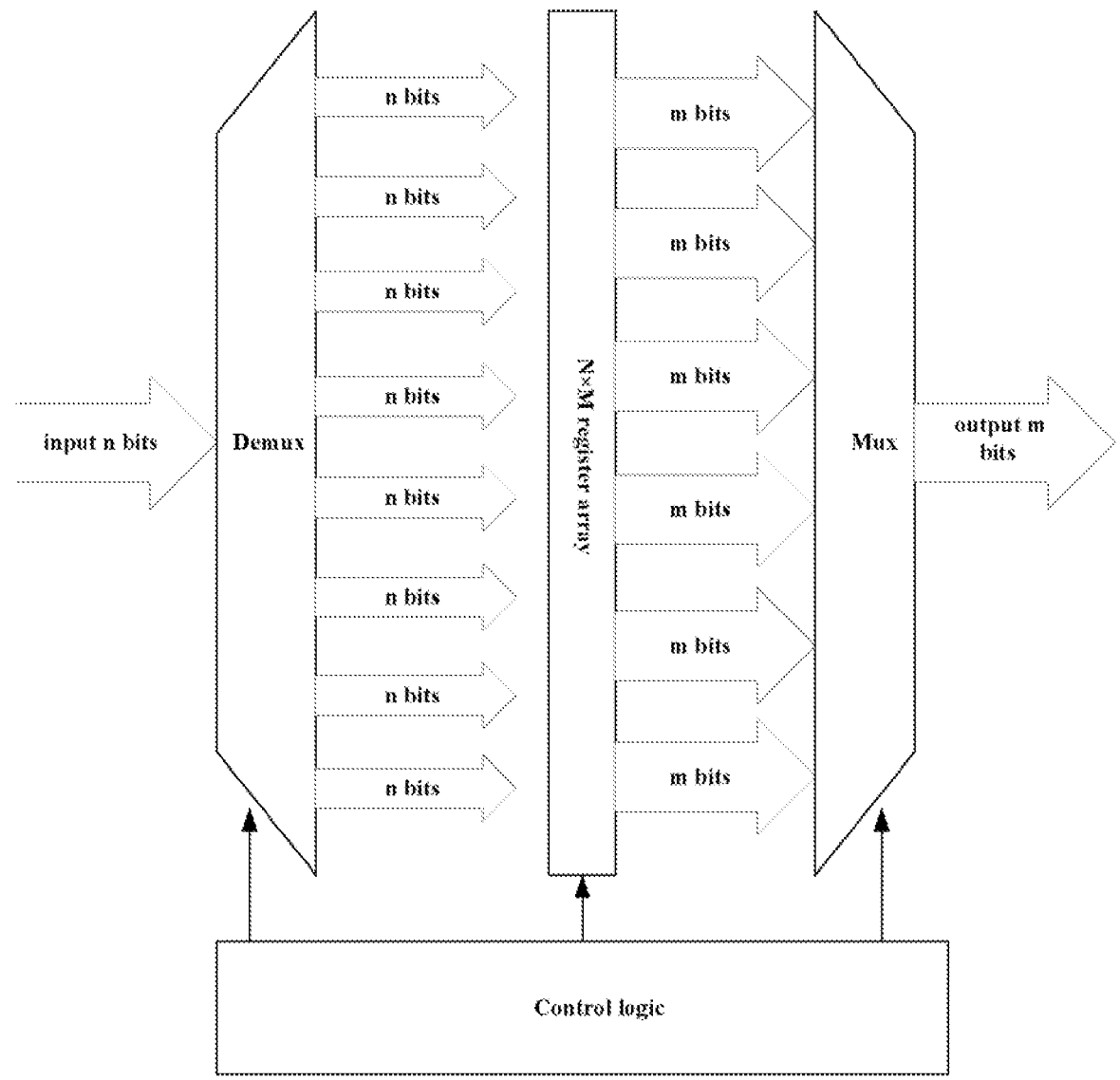
FIG. 2 is a diagram of Multiplexer (Mux) and Demultiplexer (Demux) according to the embodiment of the invention.

Probe signal transforming unit 103 can be any signal transforming unit known to those skilled in the art, as long as it can transform width and clock of said probe signal into width and clock of a signal that matches high speed serial transceiver 104. Specific examples of probe signal transforming unit 103 includes Multiplexer (Mux)/Demultiplexer (Demux), Framer/Deframer, etc. FIG. 2 is a simple implementation diagram of Mux and Demux according to the embodiment of the invention.

In FIG. 2, a register array comprises N×M registers, wherein N is the number of input bits, M is the number of output bits (when N>M, it is Mux, otherwise Demux). N and M can be configured dynamically (for Mux, M is fixed and is bit width of high speed serial transceiver 104, for example 8, for Demux, N is fixed). Assume maximal input bit width is 32 bits and output is fixed 8 bits, then there will be 256 registers. If current input bit width is 9 bits, then the 9 bits data is in turn stored at 1-9, 10-18, 19-27 . . . 64-72. After certain time delay, 1-8, 9-16, . . . 65-72 are read out at the output terminal. In case that clock at two sides is not uniform, two register arrays can be set to form a ping pong buffer. At the same time, if the speed of the read port is faster than the input port, IDLE code word (for example, all 0 or all 1) can be inserted after all the data has been read.

In addition, the FPGA 100 of the embodiment can also receive a stimulation or test signal. Specifically, the stimulation signal can be input to high speed serial transceiver 104 from outside. High speed serial transceiver 104 can convert the high speed serial stimulation signal into a low speed parallel stimulation signal, and send the low speed parallel stimulation signal to stimulation signal selecting unit 106.

Stimulation signal selecting unit 106 is used to perform switch and select between the low speed parallel stimulation signal received from high speed serial transceiver 104 and a signal that comes from other signal source 107 (for example, FPGA's signal source in practical application, etc), and apply it to logic unit under test 101. That is, stimulation signal selecting unit 106 can cut off the signal that originally comes from other signal source 107, and apply the stimulation signal that comes from high speed serial transceiver 104 to logic unit under test 101. Stimulation signal selecting unit 106 can be any signal selecting unit known to those skilled in the art, for example, the implementation of the above said selector, as long as it can switch and select between the stimulation signal and other signals and apply it to logic unit under test 101, and the invention has no limitation to this.

In addition, when the stimulation signal received by high speed serial transceiver 104 does not match stimulation signal selecting unit 106, stimulation signal transforming unit 105 can transform width and clock of said stimulation signal, i.e., transform said stimulation signal into a signal that matches stimulation signal selecting unit 106. It should be understood that stimulation signal transforming unit 105 is substantially the same as the above probe signal transforming unit 103, and could also be implemented through Mux/Demux, Framer/Deframer, etc. In addition, it is also possible to use one signal transforming unit to implement both functions of probe signal transforming unit 103 and stimulation signal transforming unit 105, and the invention has no limitation to this.

From the above description it can be seen that the FPGA 100 of the present embodiment at least has following advantages:

during testing and debugging of the FPGA 100 of the present embodiment, the resource usage of the FPGA, such as the IO pins, embedded SPAM, and trigger logic etc., is reduced;

during testing and debugging of the FPGA 100 of the present embodiment, the number of test signals is increased, for example, a high speed serial transceiver of 3.125 Gb/s can carry up to 94 signals at 33M or 63 signals at 50M;

the FPGA 100 of the present embodiment reduces the PCB cost and layout complexity;

during testing and debugging of the FPGA 100 of the present embodiment, high speed stimulation is enabled, thereby provides a debug method that is more powerful in function for debug engineers;

the high speed serial transceiver in the FPGA 100 of the present embodiment is popular in high speed FPGA and is used in many products, so that debugging of these products becomes easier;

during testing and debugging of the FPGA 100 of the present embodiment, by applying the stimulation signal, a debug engineer can test and debug the FPGA 100 of the present embodiment according to his/her own needs.

FPGA Debugging System

Figure 3:
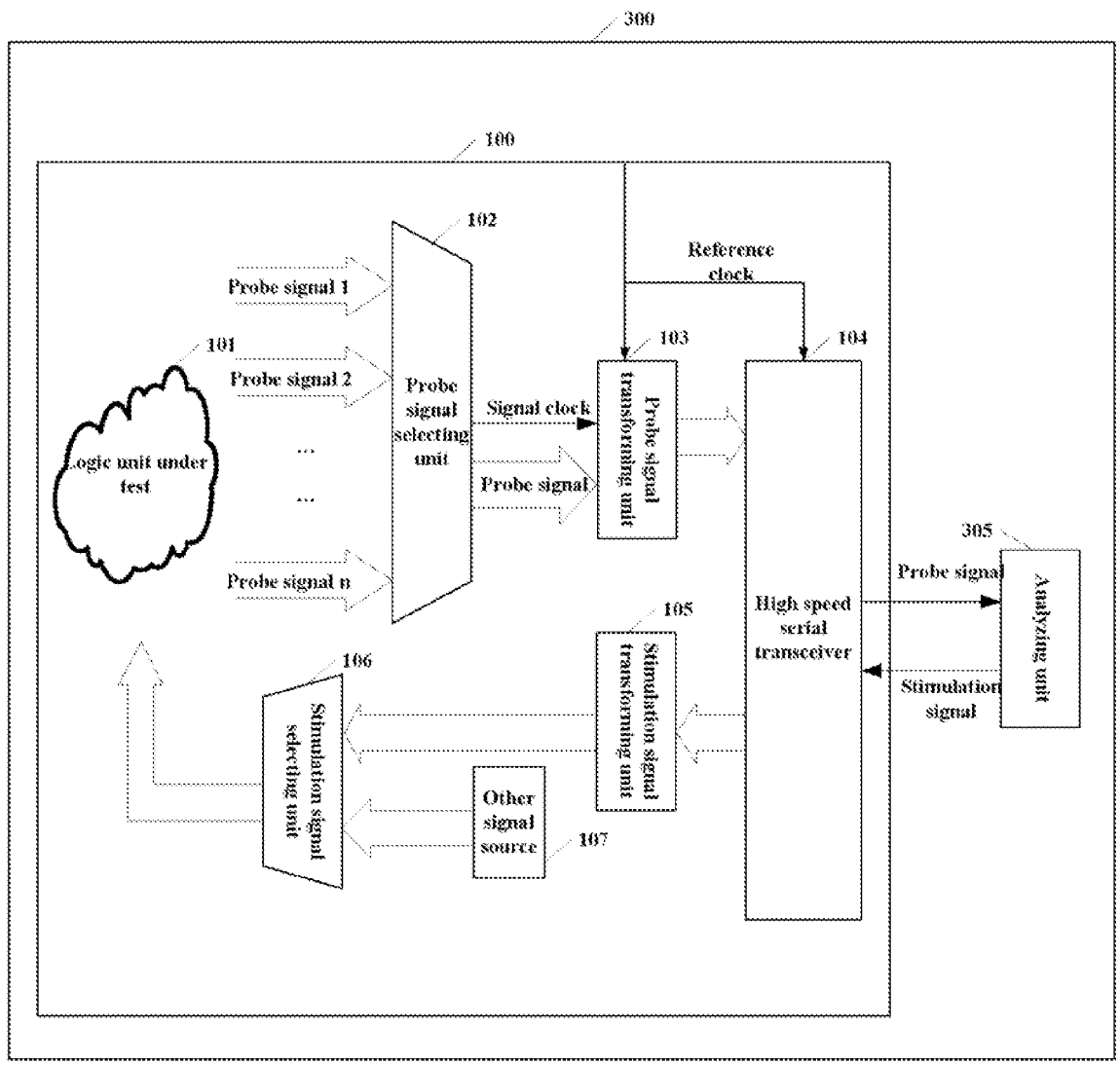
FIG. 3 is a block diagram of a system for debugging Field Programmable Gate Array according to another embodiment of the invention.

Under the same inventive conception, FIG. 3 is a block diagram of a system for debugging Field Programmable Gate Array according to another embodiment of the invention. Next, the embodiment will be described in conjunction with FIG. 3. For those same part as the above embodiment, the description of which will be properly omitted.

In FIG. 3, the system 300 for debugging Field Programmable Gate Array comprises FPGA 100 described with reference to the embodiment of FIG. 1 and analyzing means 305.

FPGA 100 comprises logic unit under test 101, probe signal selecting unit 102, probe signal transforming unit 103, high speed serial transceiver 104, stimulation signal transforming unit 105, stimulation signal selecting unit 106, and other signal source 107, the detail of which are the same as the embodiment described with reference to FIG. 1 and won't be described here for brevity.

The system 300 for debugging Field Programmable Gate Array of the present embodiment can be implemented in the following two manners.

The first manner uses probe signal selecting unit 102 to select at least one probe point from a plurality of probe points in logic unit under test 101 and obtain the probe signal at said probe point, at the same time, obtain clock of that probe signal, and send the probed probe signal and signal clock to high speed serial transceiver 104.

Then, high speed serial transceiver 104 converts said probe signal into high speed serial signal and transmits it to analyzing means 305. Analyzing means 305 analyzes said signal and FPGA 100 is debugged based on the analyze result. Analyzing means 305 can be any analyzing means known to those skilled in the art, such as analyzer or oscilloscope, which can simulate the received probe signal to determine whether logic unit under test 101 is working correctly.

In addition, when said probe signal does not match high speed serial transceiver 104, probe signal transforming unit 103 transforms the probe signal into signal that matches high speed serial transceiver 104. The detailed transform manner is the same as the embodiment described with reference to FIGS. 1 and 2 and won't be described here for brevity.

The second manner inputs the stimulation signal to high speed serial transceiver 104 through analyzing means 305. High speed serial transceiver 104 can convert high speed serial stimulation signal into low speed parallel stimulation signal, and send the low speed parallel stimulation signal to stimulation signal selecting unit 106.

Stimulation signal selecting unit 106 is used to perform switch and select between the low speed parallel stimulation signal received from high speed serial transceiver 104 and a signal that comes from other signal source 107, and apply it to logic unit under test 101. That is, stimulation signal selecting unit 106 can cut off the signal that originally comes from other signal source 107, and apply the stimulation signal that comes from high speed serial transceiver 104 to logic unit under test 101.

In addition, when the stimulation signal received by high speed serial transceiver 104 does not match stimulation signal selecting unit 106, stimulation signal transforming unit 105 can transform width and clock of said stimulation signal, i.e., transform said stimulation signal into a signal that matches stimulation signal selecting unit 106. The detailed transform manner is the same as the embodiment described with reference to FIGS. 1 and 2 and won't be described here for brevity.

Then, when FPGA uses the stimulation signal to perform logic under test thereon, it uses probe signal selecting unit 102 to select at least one probe point from a plurality of probe points in said logic unit under test 101 and obtain probe signal at said probe point, at the same time, obtain clock of that probe signal, and send the probed probe signal and signal clock to high speed serial transceiver 104. The probe signal at this time is generated under the action of said stimulation signal, thereby FPGA 100 can be purposefully tested and debugged based on the probe signal and stimulation signal.

Then, high speed serial transceiver 104 converts said probe signal into high speed serial signal and transmits it to analyzing means 305. Analyzing means 305 analyzes said signal and FPGA 100 is debugged based on the analyze result.

From the above description it can be seen that the FPGA debugging system 300 of the present embodiment at least has following advantages:

the resource usage of the FPGA, such as the IO pins, embedded SPAM, and trigger logic etc., is reduced;

the number of test signals is increased, for example, a high speed serial transceiver of 3.125 Gb/s can carry up to 94 signals at 33M or 63 signals at 50M;

the PCB cost and layout complexity is reduced, thereby reducing cost of system 300;

the FPGA debugging system 300 can perform high speed stimulation, thereby provides a debug method that is more powerful in function for debug engineers;

the high speed serial transceiver in the FPGA debugging system 300 is popular in high speed FPGA and is used in many products, so that it is easier for system 300 to debug these products;

by applying the stimulation signal, the FPGA debugging system 300 can make a debug engineer test and debug the FPGA 100 of the present embodiment according to his/her own needs.

FPGA Debugging Method

Figure 4:
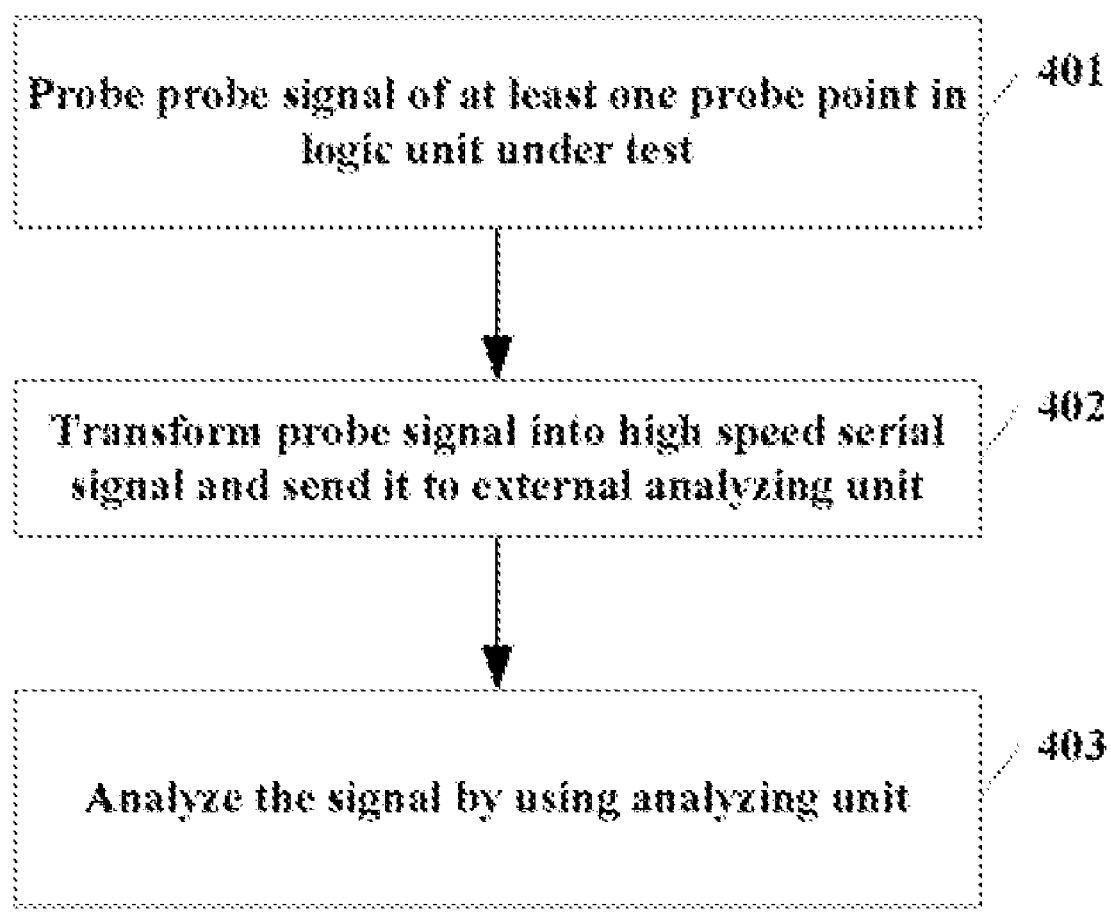
FIG. 4 is a flowchart of a method for debugging Field Programmable Gate Array according to another embodiment of the invention.

Under the same inventive conception, FIG. 4 is a flowchart of a method for debugging Field Programmable Gate Array according to another embodiment of the invention. Next, the embodiment will be described in conjunction with FIG. 4. For those same part as the above embodiment, the description of which will be properly omitted.

In FIG. 4, first at step 401, a probe signal at one or more probe points in logic unit under test within FPGA is probed and clock of the probe signal is obtained. Logic unit under test contains gate arrays that implement FPGA's logic function, and specific logic functions are realized by configuring the gate arrays. Before FPGA is put into use, designers need to test and debug logic unit under test, so that designers can identify and correct any design problems related to logic unit under test, for example, programming errors.

Next, at step 402, said probe signal is converted into high speed serial signal and is sent to an external analyzing means.

Specifically, as an example, a high speed serial transceiver can be used to convert said probe signal into high speed serial signal and send it to the external analyzing means.

High speed serial transceiver is an I/O device integrated in FPGA, which is a time division multiplexing (TDM), point-to-point communication technology, that is, at send side, multiple low speed parallel signals are transformed into a high speed serial signal, passed through transmission media (optical cable or copper cable), finally at receive side, the high speed serial signal is re-transformed into low speed parallel signals. This point-to-point serial communication technology makes full use of transmission media's channel capacity, reduces the number of transmission channels and device pins needed, and thereby significantly reduces communication cost.

A typical high speed serial transceiver comprises a send channel and a receive channel; the send channel comprises an encoder, a serializer, a sender and a clock generation circuit; the receive channel comprises a decoder, a deserializer, a receiver and a clock recovery circuit. As the name implies, the encoder and decoder realize encode and decode function, wherein 8B/10B, 64B/66B and scrambling are most commonly used encoding scheme. The serializer and deserializer are responsible for converting from parallel to serial and from serial to parallel. The serializer needs the clock generation circuit, and the clock generation circuit is often realized by phase-locked loop (PLL). The deserializer needs the clock and data recovery circuit (CDR), and generally the clock recovery circuit is also realized by the phase-locked loop, but it has many implementations such as phase interpolation, surplus sample, etc. The sender and receiver realize sending and receiving of differential signal, wherein LVDS and CML are two most commonly used differential signal standards. Also, some auxiliary circuits are necessary, such as loopback test, build-in error rate test, etc.

For detailed structure of the high speed serial transceiver, see Xilinx's technical document "Virtex-4 RocketIO Gigabit Transceiver User Guide".

In addition, when said probe signal does not match high speed serial transceiver, the method further comprises transforming the probe signal into a signal that matches the high speed serial transceiver. The detailed transform manner is the same as the embodiment described with reference to FIGS. 1 and 2 and won't be described here for brevity.

Finally, at step 403, said signal is analyzed by the analyzing means and FPGA is debugged based on the analyze result. The analyzing means can be any analyzing means known to those skilled in the art, such as analyzer or oscilloscope, which can simulate received probe signal to determine whether logic unit under test is set to desired programming state.

In addition, before step 401, the stimulation signal can also be input into FPGA in the form of high speed serial signal. Next, the high speed serial stimulation signal is converted into low speed parallel stimulation signal, at this time, if needed, width and clock of said low speed parallel stimulation signal can be transformed. Then, the signal that comes from other signal source is cut off and said stimulation signal is applied to said logic unit under test. Thereafter, step 401 through 403 is performed. At step 403, whether the logic of said logic unit under test is correct can be analyzed based on said probe signal and said stimulation signal.

From the above description it can be seen that the FPGA debugging method of the present embodiment at least has following advantages:

the resource usage of the FPGA, such as the IO pins, embedded SPAM, and trigger logic etc., is reduced;

the number of test signals is increased, for example, a high speed serial transceiver of 3.125 Gb/s can carry up to 94 signals at 33M or 63 signals at 50M;

the FPGA debugging method of the present embodiment reduces PCB cost and layout complexity for FPGA;

the FPGA debugging method can perform high speed stimulation, thereby provides a debug method that is more powerful in function for debug engineers;

the high speed serial transceiver used in the FPGA debugging method is popular in high speed FPGA and is used in many products, so that debugging of these products becomes easier;

by applying the stimulation signal, the FPGA debugging method can make a debug engineer test and debug the FPGA according to his/her own needs.

FPGA Configuration Data Product

Under the same inventive conception, there is provided a FPGA configuration data product according to one embodiment of the invention. Next, the embodiment will be described. For those same part as the above embodiment, the description of which will be properly omitted.

The FPGA configuration data product of the present embodiment, when loaded into a FPGA, enabling the FPGA to have following functional modules:

a probe signal selecting unit configured to select at least one probe point from a plurality of probe points in a logic unit under test of said FPGA, and obtain a probe signal at said probe point; and a high speed serial transceiver configured to convert said probe signal into a high speed serial signal and transmit it to outside.

In addition, when the FPGA configuration data product of the present embodiment is loaded into the FPGA, the FPGA is further enabled to have following functional modules:

a probe signal transforming unit configured to transform said probe signal into a signal that matches said high speed serial transceiver when said probe signal does not match said high speed serial transceiver, wherein said probe signal transforming unit transforms width and clock of said probe signal.

In addition, when the FPGA configuration data product of the present embodiment is loaded into the FPGA, the FPGA is further enabled to have following functions:

said high speed serial transceiver further receives a stimulation signal, and if needed, transforms the high speed serial signal into a low speed parallel signal, and said FPGA further comprises the following functional modules:

a stimulation signal selecting unit configured to select the stimulation signal or signal of other source received by said high speed serial transceiver and applying it to said logic unit under test; and a stimulation signal transforming unit configured to transform said stimulation signal into a signal that matches said stimulation signal selecting unit when the stimulation signal received by said high speed serial transceiver does not match said stimulation signal selecting unit, wherein said stimulation signal transforming unit transforms width and clock of said stimulation signal.

From the above description it can be seen that the FPGA configuration data product of the present embodiment can make a FPGA at least has following advantages:

during debugging FPGA, the resource usage of the FPGA, such as the IO pins, embedded SPAM, and trigger logic etc., is reduced;

during debugging FPGA, the number of test signals is increased, for example, a high speed serial transceiver of 3.125 Gb/s can carry up to 94 signals at 33M or 63 signals at 50M;

PCB cost and layout complexity is reduced;

during debugging FPGA, high speed stimulation can be performed, thereby provides a debug method that is more powerful in function for debug engineers;

the high speed serial transceiver involved is popular in high speed FPGA and is used in many products, so that debugging of these products becomes easier;

during debugging FPGA, by applying the stimulation signal, a debug engineer can test and debug the FPGA 100 of the present embodiment according to his/her own needs.

Method and System for Configuring a FPGA

Under the same inventive conception, there is provided a method and system for configuring a FPGA according to one embodiment of the invention. Next, the embodiment will be described. For those same part as the above embodiment, the description of which will be properly omitted.

The method for configuring a FPGA of the present embodiment comprises loading configuration data into FPGA to enable the FPGA to have following functional modules:

a probe signal selecting unit configured to select at least one probe point from a plurality of probe points in a logic unit under test of said FPGA, and obtain a probe signal at said probe point; and a high speed serial transceiver configured to convert said probe signal into a high speed serial signal and transmit it to outside.

In addition, the method for configuring a FPGA of the present embodiment can further enable the FPGA to have following functional modules: a probe signal transforming unit configured to transform said probe signal into a signal that matches said high speed serial transceiver when said probe signal does not match said high speed serial transceiver, wherein said probe signal transforming unit transforms width and clock of said stimulation signal.

In addition, the method for configuring a FPGA of the present embodiment can further enable the FPGA to have following functional modules: said high speed serial transceiver further receives a stimulation signal, and if needed, transforms the high speed serial signal into a low speed parallel signal, and said FPGA further comprises:

a stimulation signal selecting unit configured to select the stimulation signal or signal of other source received by said high speed serial transceiver and applying it to said logic unit under test; and a stimulation signal transforming unit configured to transform said stimulation signal into a signal that matches said stimulation signal selecting unit when the stimulation signal received by said high speed serial transceiver does not match said stimulation signal selecting unit, wherein said stimulation signal transforming unit transforms width and clock of said stimulation signal.

The system for configuring a FPGA of the present embodiment comprises means for loading configuration data into FPGA to enable the FPGA to have following functional modules:

a probe signal selecting unit configured to select at least one probe point from a plurality of probe points in a logic unit under test of said FPGA, and obtain a probe signal at said probe point; and a high speed serial transceiver configured to convert said probe signal into a high speed serial signal and transmit it to outside.

In addition, the system for configuring a FPGA of the present embodiment can further enable the FPGA to have following functional modules: a probe signal transforming unit configured to transform said probe signal into a signal that matches said high speed serial transceiver when said probe signal does not match said high speed serial transceiver, wherein said probe signal transforming unit transforms width and clock of said stimulation signal.

In addition, the system for configuring a FPGA of the present embodiment can further enable the FPGA to have following functional modules: said high speed serial transceiver further receives a stimulation signal, and if needed, transforms the high speed serial signal into a low speed parallel signal, and said FPGA further comprises:

a stimulation signal selecting unit configured to select the stimulation signal or signal of other source received by said high speed serial transceiver and applying it to said logic unit under test; and a stimulation signal transforming unit configured to transform said stimulation signal into a signal that matches said stimulation signal selecting unit when the stimulation signal received by said high speed serial transceiver does not match said stimulation signal selecting unit, wherein said stimulation signal transforming unit transforms width and clock of said stimulation signal.

From the above description it can be seen that the method and system for configuring a FPGA of the present embodiment can make a FPGA at least has following advantages:

during debugging FPGA, the resource usage of the FPGA, such as the IO pins, embedded SPAM, and trigger logic etc., is reduced;

during debugging FPGA, the number of test signals is increased, for example, a high speed serial transceiver of 3.125 Gb/s can carry up to 94 signals at 33M or 63 signals at 50M;

PCB cost and layout complexity is reduced;

during debugging FPGA, high speed stimulation can be performed, thereby provides a debug method that is more powerful in function for debug engineers;

the high speed serial transceiver involved is popular in high speed FPGA and is used in many products, so that debugging of these products becomes easier;

during debugging FPGA, by applying the stimulation signal, a debug engineer can test and debug the FPGA 100 of the present embodiment according to his/her own needs.

Although a Field Programmable Gate Array (FPGA), a system for debugging Field Programmable Gate Array, a method for debugging Field Programmable Gate Array, a FPGA configuration data product and method and system for configuring a FPGA of the present invention has been described in detail through some exemplary embodiments, these embodiments are not exhaustive, various variations and modifications can be made therein by those skilled in the art without departing from the spirit and scope of the invention. Therefore, the present invention is not limited to these embodiments, the scope of which is only defined by accompany claims.

That which is claimed is:

1. A Field Programmable Gate Array including a logic unit under test, the Field Programmable Gate Array comprising:
   a probe signal selecting unit configured to select at least one probe point from a plurality of probe points in said logic unit under test and obtain a probe signal at said probe point;
   a high speed serial transceiver configured to convert said probe signal into a high speed serial signal and transmit said high speed serial signal to outside the Field Programmable Gate Array, wherein said high speed serial transceiver also receives a stimulation signal;
   a stimulation signal selecting unit configured to select a stimulation signal received by said high speed serial transceiver and apply it to said logic unit under test; and
   a stimulation signal transforming unit configured to transform said stimulation signal into a signal that matches said stimulation signal selecting unit when said stimulation signal received by said high speed serial transceiver does not match said stimulation signal selecting unit.

2. The Field Programmable Gate Array according to claim 1, further comprising:
   a probe signal transforming unit configured to transform said probe signal into a signal that matches said high speed serial transceiver when said probe signal does not match said high speed serial transceiver.

3. The Field Programmable Gate Array according to claim 2, wherein said probe signal transforming unit transforms width and clock of said probe signal.

4. The Field Programmable Gate Array according to claim 1, wherein said stimulation signal transforming unit transforms width and clock of said stimulation signal.

5. The Field Programmable Gate Array according to claim 1, wherein said high speed serial transceiver converts the high speed serial signal into a low speed parallel signal.

6. A system for debugging Field Programmable Gate Arrays, the system comprising:
   a Field Programmable Gate Array including:
      a) a probe signal selecting unit configured to select at least one probe point from a plurality of probe points in said logic unit under test and obtain a probe signal at said probe point; and
      b) a high speed serial transceiver configured to convert said probe signal into a high speed serial signal and transmit said high speed serial signal to outside the Field Programmable Gate Array;
      c) a stimulation signal selecting unit configured to select a stimulation signal received by said high speed serial transceiver and apply it to said logic unit under test; and
      d) a stimulation signal transforming unit configured to transform said stimulation signal into a signal that matches said stimulation signal selecting unit when said stimulation signal received by said high speed serial transceiver does not match said stimulation signal selecting unit;
   an analyzing means configured to receive and analyze a signal sent by said high speed serial transceiver; wherein said analyzing means further sends a stimulation signal to said high speed serial transceiver.

7. The system for debugging Field Programmable Gate Arrays according to claim 6, wherein said analyzing means further sends the stimulation signal to said high speed serial transceiver.

8. A method for debugging a Field Programmable Gate Array having a logic unit under test, the method comprising:
   probing a probe signal of at least one probe point in said logic unit under test;
   converting said probe signal into a high speed serial signal and sending it to an external analyzing means;
   analyzing said signal;
   inputting a stimulation signal into said Field Programmable Gate Array in a form of a high speed serial signal;
   converting said high speed serial stimulation signal into a low speed parallel stimulation signal; and
   applying said stimulation signal to said logic unit under test.

9. The method for debugging a Field Programmable Gate Array according to claim 8, wherein said step of analyzing said signal comprises analyzing whether the logic of said logic unit under test is correct based on said signal and said stimulation signal.

10. A computer program embodied in non-transitory computer readable memory, the computer program comprising:
   a probe signal selecting module configured to select at least one probe point from a plurality of probe points in a logic unit under test of a Field Programmable Gate Array, and obtain a probe signal at said probe point;
   a configuration module for enabling a high speed serial transceiver to convert said probe signal into a high speed serial signal and transmit it to outside the Field Programmable Gate Array, wherein said high speed serial transceiver is configured to also receive a stimulation signal; and
   a stimulation signal selecting module configured to select a stimulation signal received by said high speed serial transceiver and apply it to said logic unit under test;
   a stimulation signal transforming unit configured to transform said stimulation signal into a signal that matches said stimulation signal selecting unit when said stimulation signal received by said high speed serial transceiver does not match said stimulation signal selecting unit.

11. The computer program according to claim 10, wherein said computer program further comprises
   a load module for loading configuration data into the Field Programmable Gate Array.

12. A system for configuring a Field Programmable Gate Array, comprising loading configuration data into means in the Field Programmable Gate Array to enable the Field Programmable Gate Array to have following functional modules:
   a probe signal selecting unit configured to select at least one probe point from a plurality of probe points in a logic unit under test of said Field Programmable Gate Array, and obtain a probe signal at said probe point;
   a high speed serial transceiver configured to convert said probe signal into a high speed serial signal and transmit it to outside, wherein said high speed serial transceiver also receives a stimulation signal;
   a stimulation signal selecting unit configured to select a stimulation signal received by said high speed serial transceiver or a signal of other signal sources and apply it to said logic unit under test; and
   a stimulation signal transforming unit configured to transform said stimulation signal into a signal that matches said stimulation signal selecting unit when said stimulation signal received by said high speed serial transceiver does not match said stimulation signal selecting unit.

* * * * *